United States Patent
Lee (10) Patent No.: US 7,088,634 B2
(45) Date of Patent: Aug. 8, 2006

(54) SEMICONDUCTOR MEMORY DEVICE FOR PERFORMING REFRESH OPERATION

(75) Inventor: Seong Jun Lee, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 53 days.

(21) Appl. No.: 11/008,279

(22) Filed: Dec. 10, 2004

(65) Prior Publication Data

US 2006/0013053 A1    Jan. 19, 2006

(30) Foreign Application Priority Data

Jul. 14, 2004  (KR) .................... 10-2004-0054764

(51) Int. Cl.
*G11C 7/00* (2006.01)

(52) U.S. Cl. ...................................... 365/222; 365/201

(58) Field of Classification Search ................ 365/201, 365/205, 206, 233, 222
See application file for complete search history.

(56) References Cited

U.S. PATENT DOCUMENTS

| 5,111,433 A | * | 5/1992 | Miyamoto ................ 365/201 |
| 5,636,171 A | * | 6/1997 | Yoo et al. .................... 365/222 |
| 5,654,930 A | * | 8/1997 | Yoo et al. .................... 365/222 |
| 5,657,282 A | * | 8/1997 | Lee ............................ 365/201 |
| 6,377,506 B1 | | 4/2002 | Kitazawa |
| 6,396,754 B1 | * | 5/2002 | Lee et al. ................... 365/201 |
| 6,633,504 B1 | | 10/2003 | Lee et al. |
| 6,650,581 B1 | | 11/2003 | Hong et al. |
| 6,779,136 B1 | | 8/2004 | Richter et al. |

* cited by examiner

*Primary Examiner*—Tuan T. Nguyen
*Assistant Examiner*—Alexander Sofocleous
(74) *Attorney, Agent, or Firm*—Heller Ehrman LLP (57) ABSTRACT

A semiconductor memory device including a sensing control unit, a separation control unit and a sense amplifier enable unit. The sensing control unit outputs a plurality of mat enable signals in response to a mat selecting signal, a clock enable signal, a refresh signal and a test mode signal. The separation control unit outputs a plurality of separation control signals which control driving of a separation transistor adjacent to the mat in response to the plurality of mat enable signals. The sense amplifier enable unit outputs a sense amplifier enable signal for controlling driving of the sense amplifier in response to the clock enable signal, the mat selecting signal, the test mode signal and the refresh signal. In the semiconductor memory device, a refresh operation is performed at an unlimited sense amplifier test mode.

10 Claims, 10 Drawing Sheets

SEMICONDUCTOR MEMORY DEVICE FOR PERFORMING REFRESH OPERATION

BACKGROUND OF THE INVENTION

1. Field of the Invention

The present invention generally relates to a semiconductor memory device for performing a refresh operation, and more specifically, to a technology for performing a refresh operation in an unlimited sense amplifier test mode.

2. Description of the Prior Art

Generally, a semiconductor memory device, which stores data in a plurality of memory cells or reads the stored data, comprises a plurality of bit lines, a plurality of word lines, a plurality of circuits for selecting the bit lines and the word lines, and a plurality of sense amplifiers.

Figure 1:
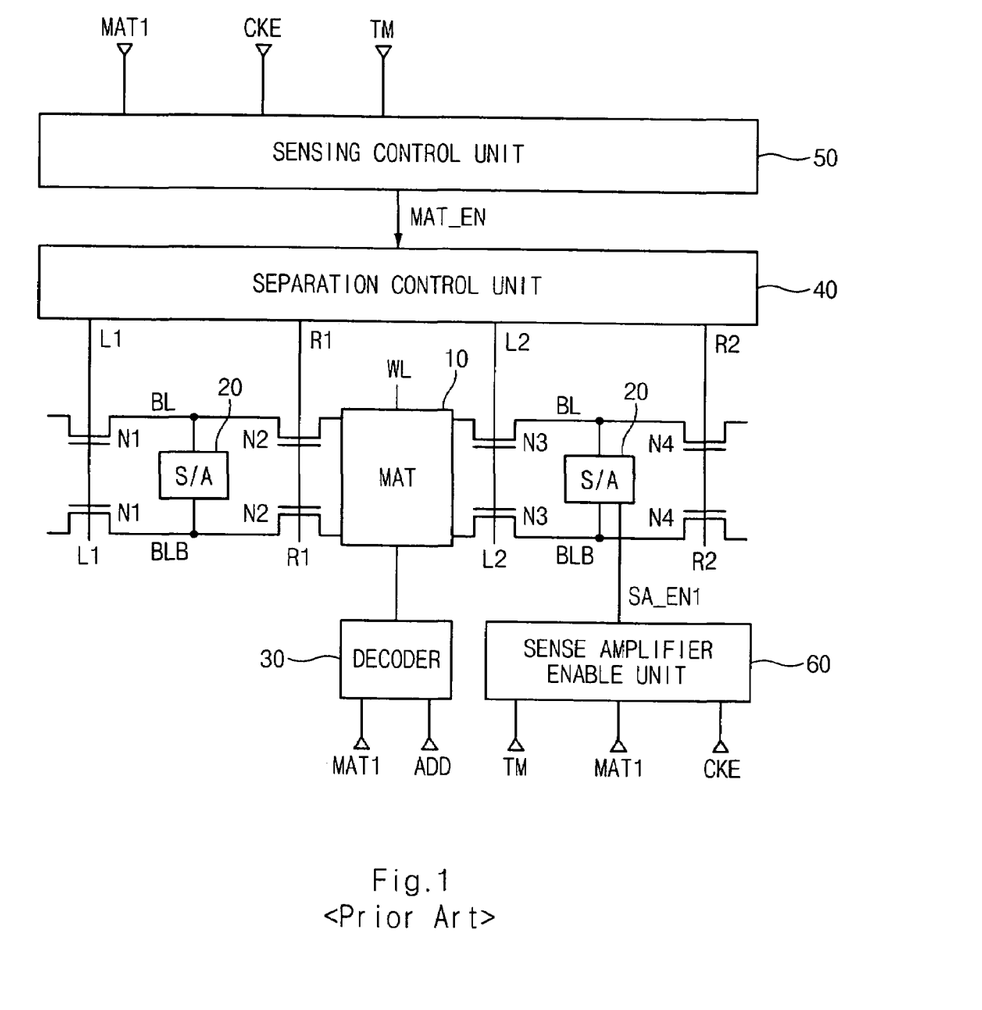
FIG. 1 is a diagram illustrating a conventional semiconductor memory device.

FIG. 1 is a diagram illustrating a conventional semiconductor memory device.

The conventional semiconductor memory device comprises a mat 10 having a plurality of cells, two sense amplifiers 20 connected to one mat 10, a decoder 30, a separation control unit 40, a sensing control unit 50 and a sense amplifier enable unit 60.

The mat 10 comprises the plurality of cells connected to a plurality of word line WL and paired bit lines BL, BLB, and stores data in each cell.

The sense amplifier 20, which is connected between paired bit lines BL, BLB, senses and amplifies data in the paired bit lines BL, BLB in response to a sense amplifier enable signal SA_EN1.

The decoder 30 decodes a mat selecting signal MAT1 and a row address ADD, and outputs a word line selecting signal for selecting a word line WL of a cell.

The separation control unit 40 outputs separation control signals L1, R1, L2, R2 for controlling bit line separation transistors N1~N4 in response to a mat enable signal MAT_EN from a sensing control unit 50.

The sensing control unit 50 receives the mat selecting signal MAT1, a clock enable signal CKE and a test mode signal TM, and outputs the mat enable signal MAT_EN.

The sense amplifier enable unit 60 receives a test mode signal TM, the mat selecting signal MAT1 and the clock enable signal CKE, and outputs the sense amplifier enable signal SA_EN1.

Figure 2:
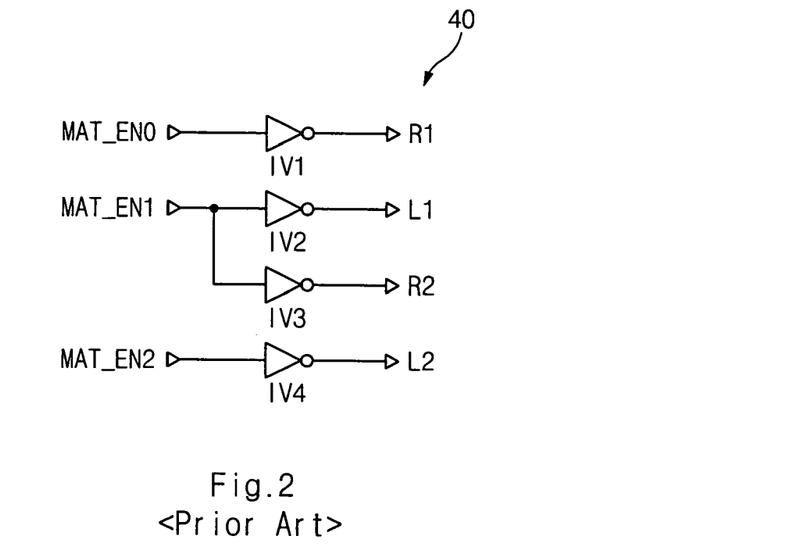
FIG. 2 is a circuit diagram illustrating a separation control unit of FIG. 1.

FIG. 2 is a circuit diagram illustrating the separation control unit 40 of FIG. 1.

The separation control unit 40 comprises a plurality of inverters IV1~IV4.

The plurality of inverters IV1~IV4 invert a plurality of mat enable signals MAT_EN0~MAT_EN2, and outputs separation control signals R1, R2, L1, L2, respectively.

Figure 3:
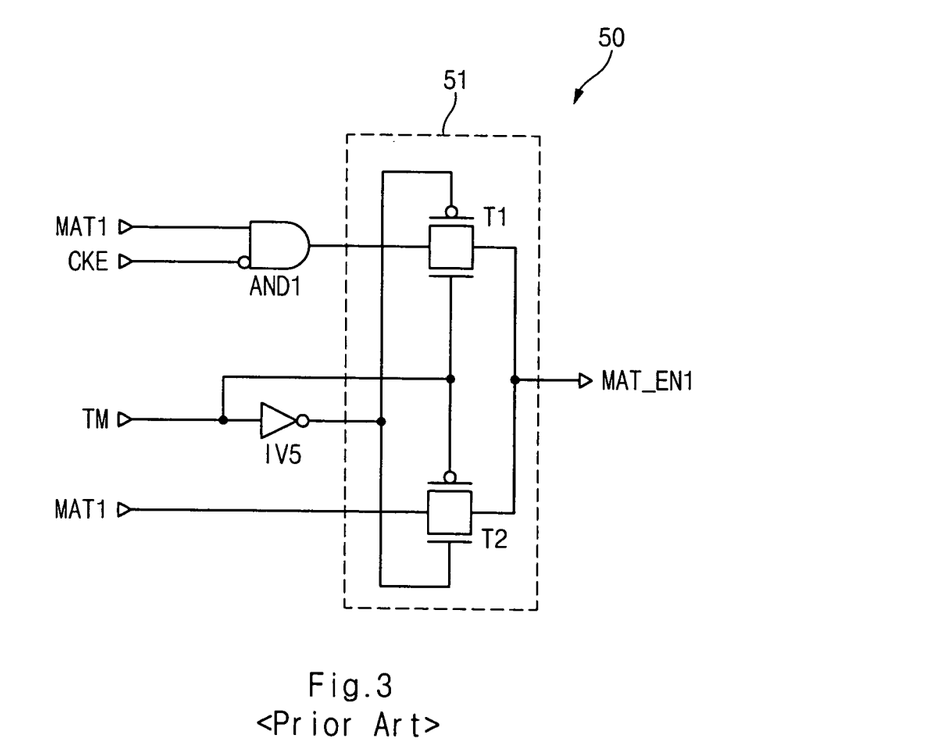
FIG. 3 is a circuit diagram illustrating a sensing control unit of FIG. 1.

FIG. 3 is a circuit diagram illustrating the sensing control unit 50 of FIG. 1.

The sensing control unit 50 comprises an AND gate AND1, an inverter IV5 and a transmission unit 51.

The AND gate AND1 performs an AND operation on the mat selecting signal MAT1 and a signal obtained by inverting the clock enable signal CKE. The inverter IV5 inverts the test mode signal TM. The transmission unit 51, which comprises transmission gates T1 and T2 controlled by the test mode signal TM and an output signal from the inverter IV5, selectively outputs an output signal from the AND gate AND1 and the mat selecting signal MAT1 as the mat enable signal MAT_EN1.

Figure 4:
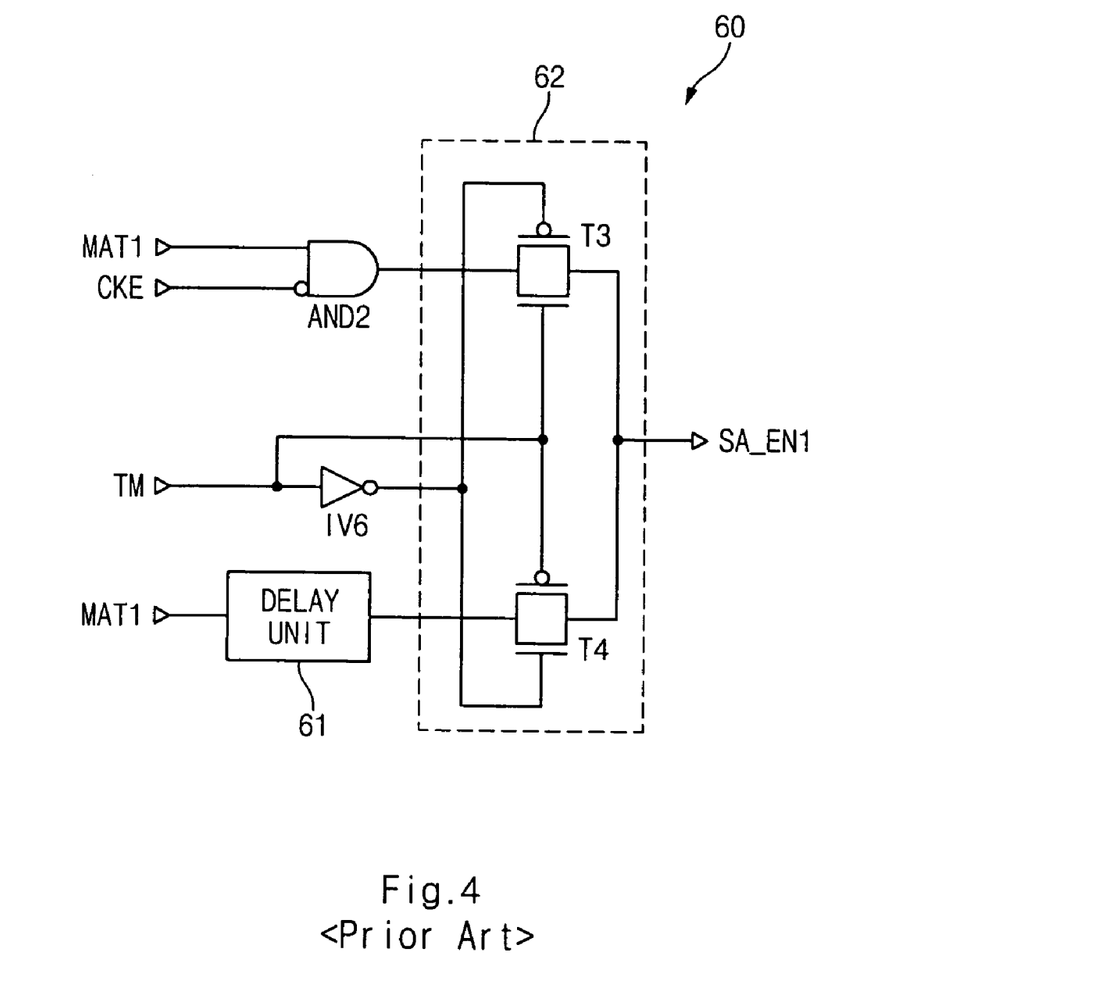
FIG. 4 is a circuit diagram illustrating a sense amplifier enable unit of FIG. 1.

FIG. 4 is a circuit diagram illustrating the sense amplifier enable unit 60 of FIG. 1.

The sense amplifier enable unit 60 comprises an AND gate AND2, an inverter IV6, a delay unit 61 and a transmission unit 62.

The AND gate AND2 performs an AND operation on the mat selecting signal MAT1 and a signal obtained by inverting the clock enable signal CKE. The inverter IV6 inverts the test mode signal TM, and the delay unit 61 delays and outputs the mat selecting signal MAT1.

The transmission unit 62, which comprises transmission gates T3 and T4 controlled by the test mode signal TM and an output signal from the inverter IV6, selectively outputs output signals from the AND gate AND2 and the delay unit 61 as the sense amplifier enable signal SA_EN1.

In the above-described semiconductor memory device, a micro-bridge is generated between a word line and a storage node or between a word line and a bit line during a general semiconductor process. As a result, an unlimited sense amplifier test mode is used to screen the micro-bridge.

More specifically, the unlimited sense amplifier test mode is a system to screen the micro-bridge between a word line and a storage node or between a word line and a bit line by sufficiently delaying sense amplifier driving start time while bit lines are kept being developed.

Hereinafter, the operation of the conventional semiconductor memory device at the normal mode and at the unlimited sense amplifier test mode is explained with reference to FIGS. 5a to 5c.

First, at the normal mode, the transmission T2 of the sensing control unit 50 and the transmission gate T4 of the sensing control unit 60 are turned on by the test mode signal TM at a low level.

As a result, the transmission gate T2 outputs the mat selecting signal MAT1 at a high level as the mat enable signal MAT_EN1, and the transmission gate T4 outputs an output signal from the delay unit 61 as the sense amplifier enable signal SA_EN1. As shown in FIG. 5a, the sense amplifier enable signal SA_EN1 is delayed longer than the mat enable signal MAT_EN1, and enabled at a high level. Here, the separation control signals L1 and R2 become at a low level to turn off the bit line separation transistors N1 and N4.

Figure 5A:
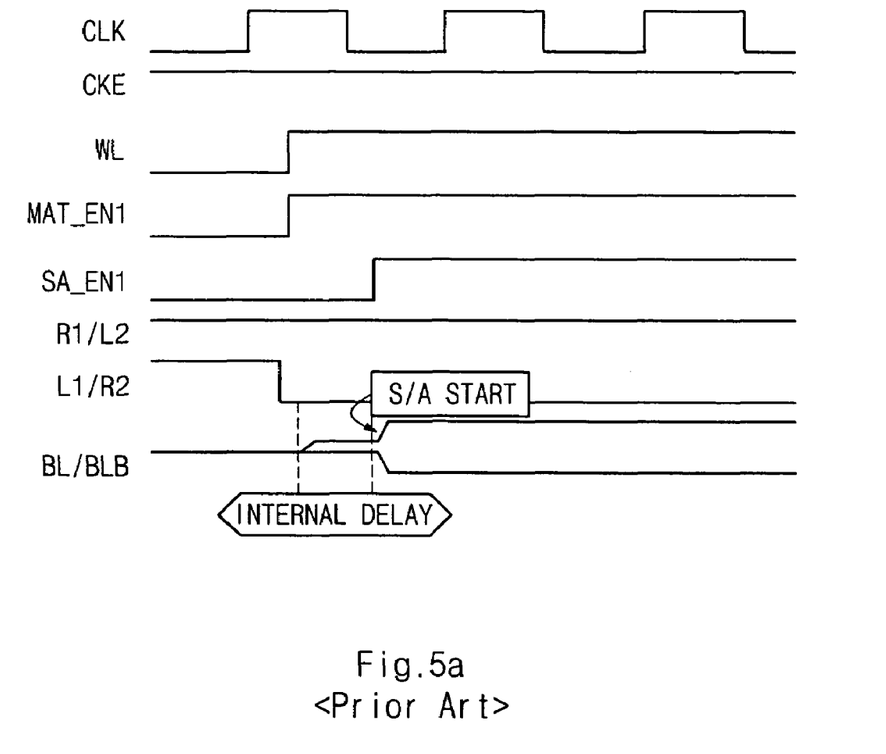
FIGS. 5a to 5c are timing diagrams illustrating the operation of the semiconductor memory device of FIG. 1.

As shown in FIG. 5a, at the normal mode, when the word line WL is enabled at a high level and the mat enable signal MAT_EN1 is enabled at a high level, the separation control signals L1 and R2 are disabled at a low level. If the separation control signals L1 and R2 are disabled at the low level, charges stored in the pair of bit lines and the cell are charge-shared. After a predetermined period, when the sense amplifier enable signal SA_EN1 is enabled at the high level, the sense amplifier 20 starts driving and then the pair of bit lines are developed. The development of the paired bit lines BL, BLB is to amplify a bit line BL to a core voltage VCORE level and a bit line bar BLB to a ground voltage VSS level.

Second, at the unlimited sense amplifier test mode, the transmission gate T1 of the sensing control unit 50 and the transmission gate T3 of the sensing control unit 60 are turned on by the test mode signal TM at a high level.

As a result, the transmission gate T1 outputs the output signal from the AND gate AND1 as the mat enable signal MAT_EN1, and the transmission gate T3 outputs the output signal from the AND gate AND2 as the sense amplifier enable signal SA_EN1.

Here, the AND gate AND1 performs an AND operation on the mat selecting signal MAT1 at the high level and a signal obtained by inverting the clock enable signal CKE at a low level, and outputs a low level signal. Then, when the clock enable signal CKE is disabled to a low level, the AND gate AND1 outputs a high level signal. That is, the mat enable signal MAT_EN1 is outputted at the low level when the clock enable signal CKE is at the high level, and enabled to the high level when the clock enable signal CKE is disabled to the low level. At the same time, the sense amplifier enable signal SA_EN1 is transited with the mat enable signal MAT_EN1.

Figure 5B:
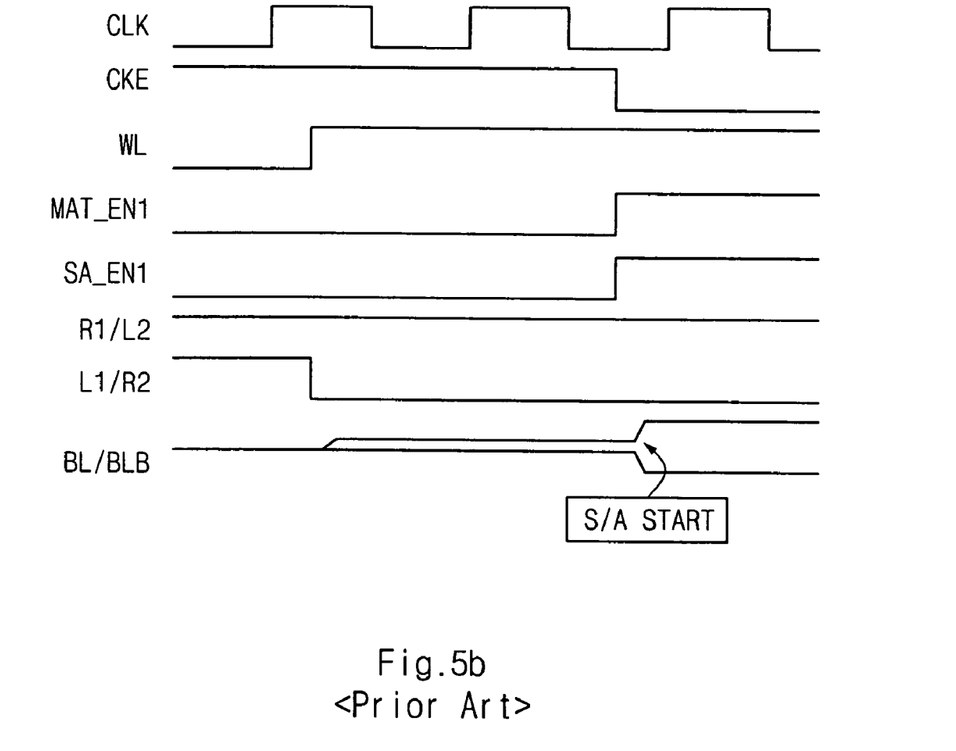

As shown in FIG. 5b, at the unlimited sense amplifier test mode, when the word line WL is enabled to a high level and the clock enable signal CKE is disabled to the low level, the mat enable signal MAT_EN1 and the sense amplifier enable signal SA_EN1 are enabled to the high level, so that the sense amplifier 20 starts driving and then the pair of bit lines are developed.

Third, when a refresh operation is performed at the unlimited sense amplifier test mode, the unlimited sense amplifier test mode is required to be stopped to perform the refresh operation, since a refresh signal is not applied to the sensing control unit 50 and the sense amplifier enable unit 60.

Figure 5C:
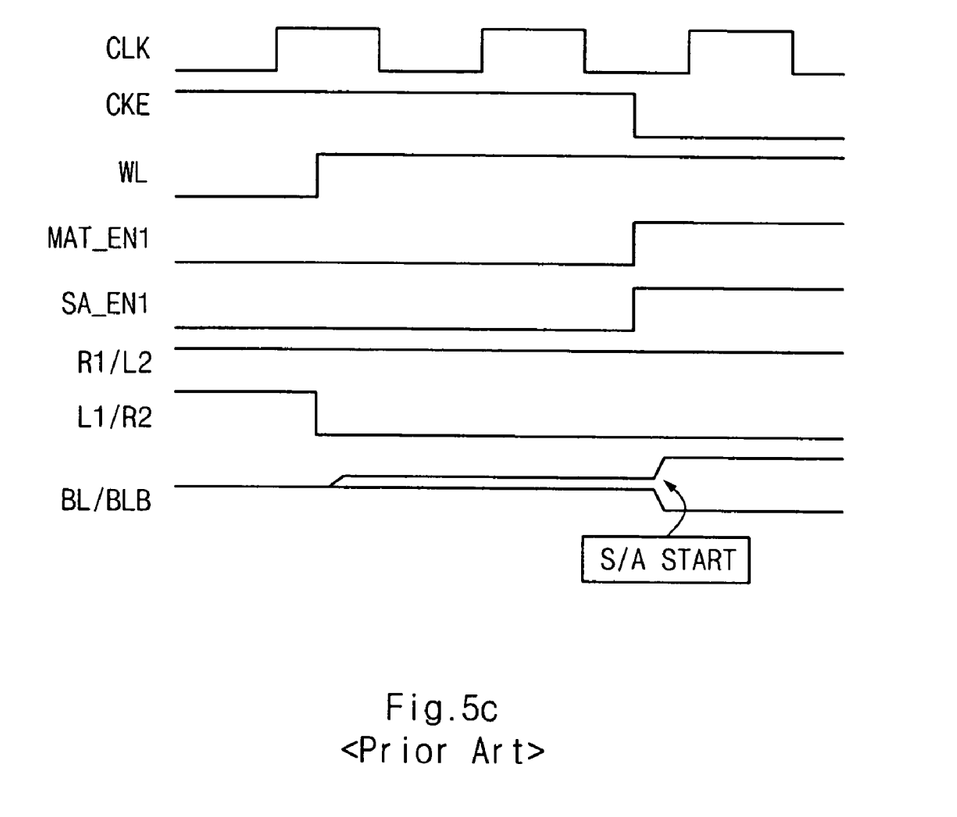

In other words, when the refresh operation is performed at the unlimited sense amplifier test mode as shown in FIG. 5c, the sensing control unit 50 and the sense amplifier enable unit 60 are driven only at a test mode as at the unlimited sense amplifier test mode, and it is difficult to perform the refresh operation.

SUMMARY OF THE INVENTION

Accordingly, it is an object of the present invention to perform the refresh operation at the unlimited sense amplifier test mode.

A semiconductor memory device, which includes a plurality of mats and a plurality of sense amplifiers for amplifying data of the mats, for performing a refresh operation, comprises a sensing control unit, a separation control unit and a sense amplifier enable unit. The sensing control unit outputs a plurality of mat enable signals in response to a mat selecting signal, a clock enable signal, a refresh signal for representing a refresh mode and a test mode signal for representing a test mode. The separation control unit outputs a plurality of separation control signals which control driving of a separation transistor adjacent to the mat in response to the plurality of mat enable signals. The sense amplifier enable unit outputs a sense amplifier enable signal for controlling driving of the sense amplifier in response to the clock enable signal, the mat selecting signal, the test mode signal and the refresh signal.

The present invention can be applied to all semiconductor memory devices, and particularly is effective in the semiconductor memory device which requires an auto-refresh operation.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 6:
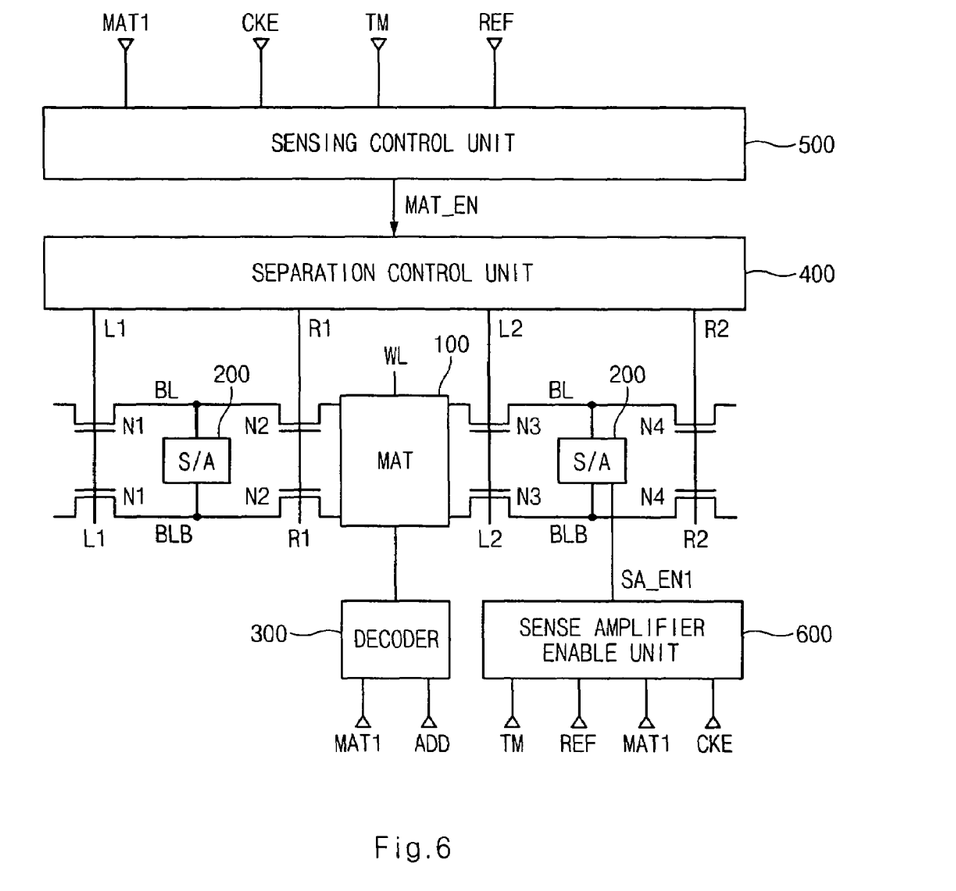
FIG. 6 is a diagram illustrating a semiconductor memory device according to an embodiment of the present invention.

FIG. 6 is a diagram illustrating a semiconductor memory device according to an embodiment of the present invention.

In an embodiment, a semiconductor memory device comprises a mat 100 having a plurality of cells, two sense amplifiers 200 connected to one mat 100, a decoder 300, a separation control unit 400, a sensing control unit 500 and a sense amplifier enable unit 600.

The mat 100, which has the plurality of cells connected to a plurality of word lines and paired bit lines, stores data in each cell.

The sense amplifier 200, which is connected to the paired bit lines BL, BLB, senses and amplifies data in the bit line BL in response to a sense amplifier enable signal SA_EN1.

The decoder 300 decodes a mat selecting signal MAT1 and a row address ADD to output a word line selecting signal for selecting a word line of the cell.

The separation control unit 400 outputs separation control signals L1, R1, L2 and R2 for controlling bit line separation transistors N1~N4 in response to a mat enable signal MAT_EN from sensing control unit 500.

The sensing control unit 500 receives the mat selecting signal MAT1, a clock enable signal CKE, a refresh signal REF and a test mode signal TM, and outputs the sense amplifier enable signal SA_EN1.

Figure 7:
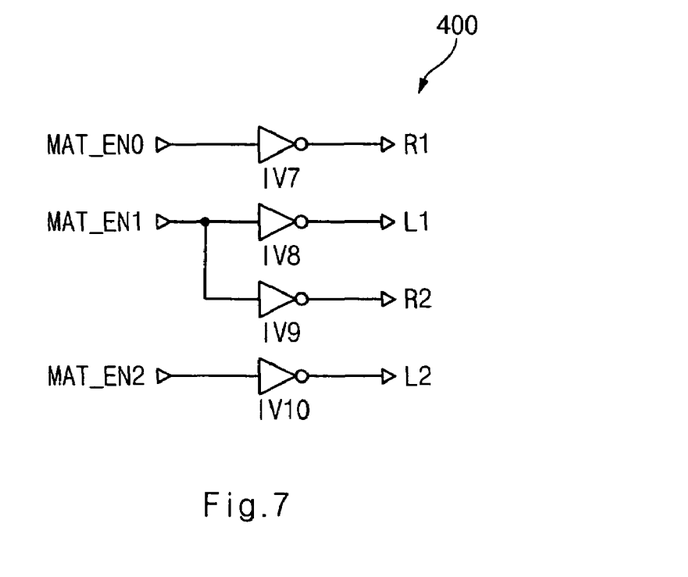
FIG. 7 is a circuit diagram illustrating a separation control unit of FIG. 6.

FIG. 7 is a circuit diagram illustrating the separation control unit 400 of FIG. 6.

The separation control unit 600, which comprises a plurality of inverters I7~IV10, inverts a plurality of mat enable signals MAT_EN0~MAT_EN2 to output the separation control signals L1, R1, L2 and R2.

For example, when the mat 100 is selected, the mat enable signals MAT_EN0 and MAT_EN2 are maintained at a high level, and the mat enable signal MAT_EN1 is maintained at a low level, so that the separation control signal R1 and L2 are disabled to a low level and the separation control signal L1 and R2 is enabled to a high level. As a result, the bit line transistors N1 and N4 are turned off by the separation control signals R1 and L2 at the low level, and the bit line transistors N2 and N3 adjacent to the mat 100 are turned on by the separation control signals R1 and L2 at the high level.

Figure 8:
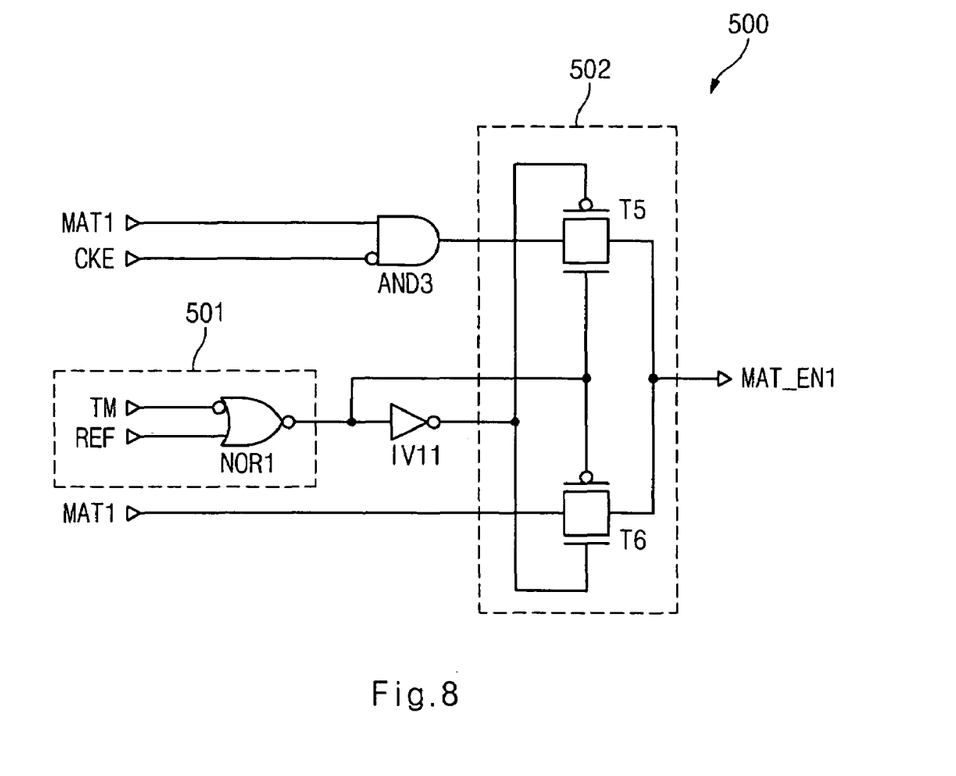
FIG. 8 is a circuit diagram illustrating a sensing control unit of FIG. 6.

FIG. 8 is a circuit diagram illustrating the sensing control unit 500 of FIG. 6.

The sensing control unit 500 comprises an AND gate AND3, a control unit 501, an inverter IV11 and a transmission unit 502.

The AND gate AND3 performs an AND operation on the mat selecting signal MAT1 and a signal obtained by inverting the clock enable signal CKE.

The control unit 501 comprises a NOR gate NOR1 for performing a NOR operation on the test mode signal TM and the refresh signal REF. The inverter IV11 inverts an output signal from the NOR gate NOR1.

The transmission unit 502 comprises transmission gates T5 and T6 for selectively outputting an output signal from the AND gate AND3 and the mat selecting signal MAT1 as the mat enable signal MAT_EN1 in response to output signals from the NOR gate NOR1 and the inverter IV11, respectively.

Figure 9:
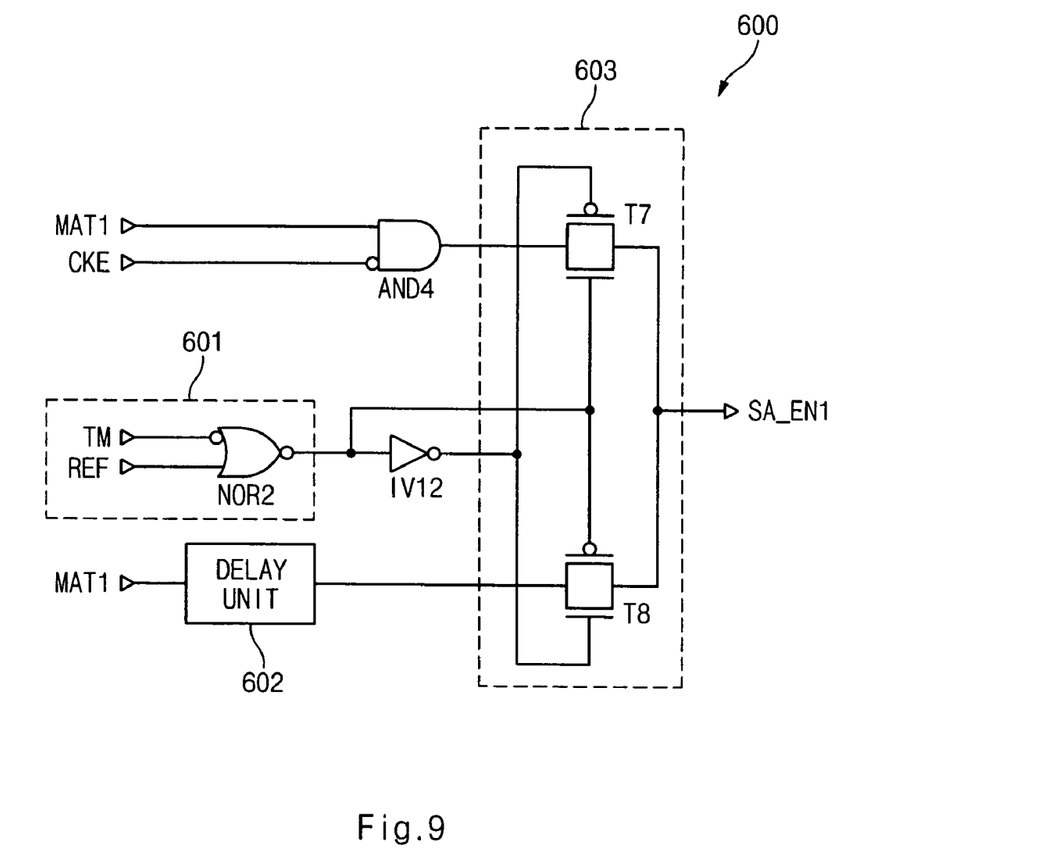
FIG. 9 is a circuit diagram illustrating a sense amplifier enable unit of FIG. 6.

FIG. 9 is a circuit diagram illustrating the sense amplifier enable unit 600 of FIG. 6.

The sense amplifier enable unit 600 comprises an AND gate AND4, a control unit 601, an inverter IV12, a delay unit 602 and a transmission unit 603.

The AND gate AND4 performs an AND operation on the mat selecting signal MAT1 and the signal obtained by inverting the clock enable signal CKE. The control unit 601 comprises a NOR gate NOR2 for performing a NOR operation on the refresh signal REF and a signal obtained by inverting the test mode signal TM. The inverter IV12 inverts an output signal from the NOR gate NOR2, and the delay unit 602 delays the mat selecting signal MAT1.

The transmission unit 603 comprises transmission gates T7 and T8 for selectively outputting output signals from the AND gate AND4 and the delay unit 602 as the sense amplifier enable signal SA_EN in response to output signals from the NOR gate NOR2 and the inverter IV12, respectively.

Hereinafter, operations performed at a normal mode, an unlimited sense amplifier test mode, and a refresh operation performed at the unlimited sense amplifier test mode in a semiconductor memory device according to an embodiment of the present invention are described with reference to Table 1 and FIG. 10.

from the AND gate AND3 as the mat enable signal MAT_EN1 and the transmission gate T7 outputs an output signal from the AND gate AND4 as the sense amplifier enable signal SA_EN1.

Here, the AND gate AND3 performs an AND operation on the mat selecting signal at the high level and the signal obtained by inverting the clock enable signal CKE at the high level to output a low level signal, and outputs a high level signal when the clock enable signal CKE is disabled to the low level. That is, the mat enable signal MAT_EN1 is outputted at the low level when the clock enable signal CKE is at the high level, and enabled to the high level when the clock enable signal CKE is disabled to the low level. Also, the sense amplifier enable signal SA_EN1 is transited with the mat enable signal MAT_EN1.

At the unlimited sense amplifier test mode, as shown in FIG. 5*b*, when a word line WL is enabled to a high level and the clock enable signal CKE is disabled to the low level, the mat enable signal MAT_EN1 and the sense amplifier enable signal SA_EN1 are enabled to the high level. Then, the sense amplifier 20 starts driving, and the paired bit lines are developed.

Third, when the refresh operation is performed at the unlimited sense amplifier test mode, the control units 501 and 601 of the sensing control unit 500 and the sense amplifier enable unit 600 receive the test mode signal TM and the refresh signal REF at the high level to output a low level signal. As a result, the transmission gates T6 and T8 are turned on, so that the transmission gate T6 outputs the mat selecting signal MAT1 at the high level as the mat enable signal MAT_EN1 and the transmission gate T8 outputs the output signal from the delay unit 602 as the sense amplifier enable signal SA_EN1.

TABLE 1

| Mode | MAT1 | CKE | TM | REF | Transmission gate | MAT_EN1 | SA_EN1 |
|---|---|---|---|---|---|---|---|
| Normal | H | H or L | L | L | T6, T8 | H | H |
| Test | H | H | H | L | T5, T7 | L | L |
|  | H | L | H | L | T5, T7 | H | H |
| Test + Refresh | H | H | H | H | T6, T8 | H | H |

First, the control units 501 and 601 of the sensing control unit 500 and the sense amplifier enable unit 600 receive the test mode signal TM and the refresh signal REF at the low level, and output a low level signal. As a result, the transmission gates T6 and T8 are turned on, so that the transmission gate T6 outputs the mat selecting signal MAT1 at the high level as the mat enable signal MAT_EN1 and the transmission gate T8 outputs an output signal from the delay unit 602 as the sense amplifier enable signal SA_EN1.

As shown in FIG. 5*a,* after the mat enable signal MAT_EN1 is enabled to a high level and a predetermined delay time passes, the sense amplifier enable signal SA_EN1 is enabled to a high level. Then, the sense amplifier 200 starts driving and the paired bit lines are developed.

Second, at the unlimited sense amplifier test mode, the control units 501 and 601 of the sensing control unit 500 and the sense amplifier enable unit 600 receive the test mode signal TM at the high level and the refresh signal REF at the low level, and outputs a high level signal.

Figure 10:
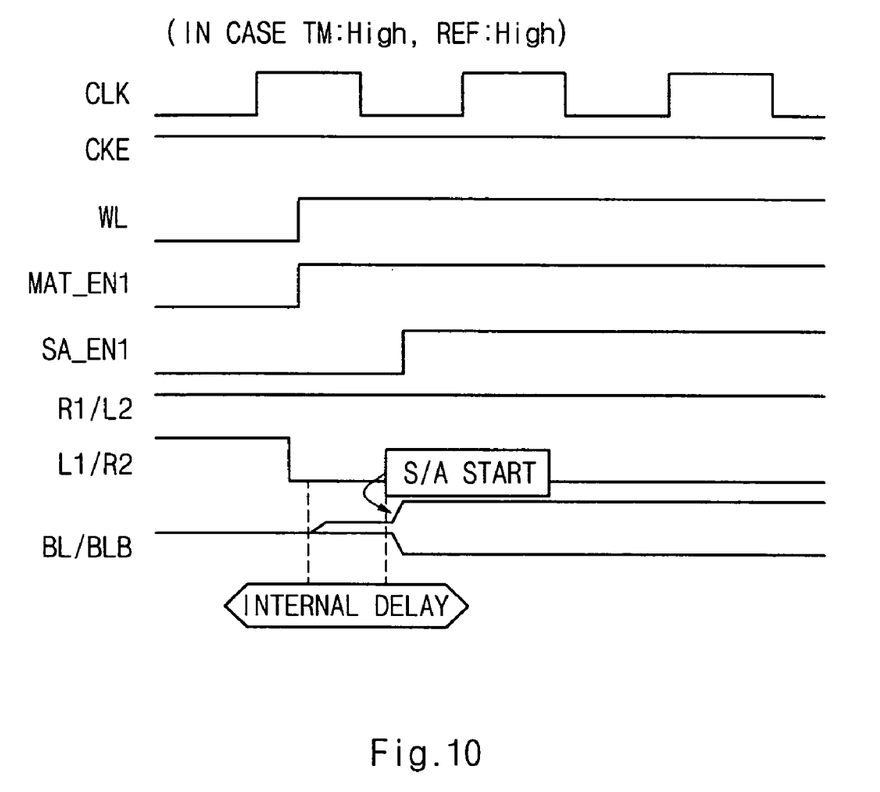
FIG. 10 is a timing diagram illustrating the operation of the semiconductor memory device of FIG. 6.

As a result, the transmission gates T5 and T7 are turned on, so that the transmission gate T5 outputs an output signal As shown in FIG. 10, after the mat enable signal MAT_EN1 is enabled to the high level and a predetermined delay time passes, the sense amplifier enable signal SA_EN1 is enabled to the high level, so that the sense amplifier 200 starts driving and the paired bit lines are developed. Here, the clock enable signal CKE as a signal inputted externally is maintained at the high level at the refresh mode like at the normal mode.

As described above, in an embodiment of the present invention, the refresh operation can be performed at the unlimited sense amplifier test mode regardless of the clock enable signal CKE.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A semiconductor memory device, which includes a plurality of mats and a plurality of sense amplifiers for amplifying data of the mats, for performing a refresh operation, comprising:
   a sensing control unit for outputting a plurality of mat enable signals in response to a mat selecting signal, a clock enable signal, a refresh signal for representing a refresh mode and a test mode signal for representing a test mode;
   a separation control unit for outputting a plurality of separation control signals which control driving of a separation transistor adjacent to the mat in response to the plurality of mat enable signals; and
   a sense amplifier enable unit for outputting a sense amplifier enable signal for controlling driving of the sense amplifier in response to the clock enable signal, the mat selecting signal, the test mode signal and the refresh signal,
   wherein the refresh operation is performable in the test mode.

2. The device according to claim 1, wherein the separation control unit comprises a plurality of inverters for inverting the mat enable signal to output the plurality of separation control signals.

3. The device according to claim 1, wherein the sensing control unit comprises:
   a control unit for combining the test mode signal and the refresh signal;
   a logic operation unit for logically combining the mat selecting signal and the clock enable signal; and
   a transmission unit for selectively outputting the mat selecting signal and an output signal from the logic operation unit in response to an output signal from the control unit.

4. The device according to claim 3, wherein the control unit comprises a NOR gate for performing a NOR operation on the refresh signal and a signal obtained by inverting the test mode signal.

5. The device according to claim 3, wherein the logic operation unit comprises an AND gate for performing an AND operation on the mat selecting signal and a signal obtained by inverting the clock enable signal.

6. The device according to claim 3, wherein the transmission unit comprises a plurality of transmission gates.

7. The device according to claim 1, wherein the sense amplifier enable unit comprises:
   a control unit for combining the test mode signal and the refresh signal;
   a logic operation unit for logically combining the mat selecting signal and the clock enable signal;
   a delay unit for delaying the mat selecting signal; and
   a transmission unit for selectively outputting output signals from the logic operation unit and the delay unit in response to an output signal from the control unit.

8. The device according to claim 7, wherein the control unit comprises a NOR gate for performing a NOR operation on the refresh signal and a signal obtained by inverting the test mode signal.

9. The device according to claim 7, wherein the logic operation unit comprises an AND gate for performing an AND operation on the mat selecting signal and a signal obtained by inverting the clock enable signal.

10. The device according to claim 7, wherein the transmission unit comprises a plurality of transmission gates.

* * * * *